United States Patent
Bosson et al.

(10) Patent No.: US 11,912,161 B2
(45) Date of Patent: Feb. 27, 2024

(54) SYSTEM FOR ON-SITE DIAGNOSIS OF THE BATTERY OF AN ELECTRIC BICYCLE

(71) Applicant: EBIKELABS, Grenoble (FR)

(72) Inventors: Maël Bosson, Grenoble (FR); Raphaël Marguet, Grenoble (FR); Theophile Alary, Grenoble (FR)

(73) Assignee: EBIKELABS, Grenoble (FR)

( * ) Notice: Subject to any disclaimer, the term of this patent is extended or adjusted under 35 U.S.C. 154(b) by 397 days.

(21) Appl. No.: 17/309,035

(22) PCT Filed: Sep. 25, 2019

(86) PCT No.: PCT/FR2019/052261
§ 371 (c)(1),
(2) Date: Apr. 15, 2021

(87) PCT Pub. No.: WO2020/079336
PCT Pub. Date: Apr. 23, 2020

(65) Prior Publication Data
US 2022/0024348 A1 Jan. 27, 2022

(30) Foreign Application Priority Data
Oct. 16, 2018 (FR) ...................................... 1859568

(51) Int. Cl.
*B60L 58/16* (2019.01)
*H02P 29/60* (2016.01)
(Continued)

(52) U.S. Cl.
CPC ................ *B60L 58/16* (2019.02); *B60L 3/12* (2013.01); *B60L 50/20* (2019.02); *G01R 31/392* (2019.01);
(Continued)

(58) Field of Classification Search
CPC .. B60L 58/16; B60L 3/12; B60L 50/20; B60L 2200/12; B60L 2240/425;
(Continued)

(56) References Cited

U.S. PATENT DOCUMENTS 3,995,204 A * 11/1976 Konrad .................... H02P 3/08
318/367
6,446,745 B1 * 9/2002 Lee .......................... B62M 6/65
180/220
(Continued)

FOREIGN PATENT DOCUMENTS

EP 3127739 A1 2/2017
FR 2920884 A1 3/2009

OTHER PUBLICATIONS

International Search Report dated Jan. 23, 2020 in connection with International Application No. PCT/FR2019/052261, 15 pages.
(Continued)

*Primary Examiner* — David Luo

(57) ABSTRACT

The invention relates to a method for in-place diagnosis of a rechargeable electric vehicle battery, comprising the following steps: discharging the battery in a motor of the vehicle, using an internal resistance of the motor as a resistive load; measuring parameters of the battery during discharge to establish a state of health of the battery; estimating the temperature of the motor during discharge; and regulating the discharge current to stabilize the temperature of the motor at a constant admissible threshold.

7 Claims, 2 Drawing Sheets

(51) Int. Cl.
*G01R 31/392* (2019.01)
*B60L 50/20* (2019.01)
*H02J 7/00* (2006.01)
*B60L 3/12* (2006.01)
*H02P 27/06* (2006.01)

(52) U.S. Cl.
CPC ............. *H02J 7/005* (2020.01); *H02J 7/007* (2013.01); *H02P 27/06* (2013.01); *H02P 29/60* (2016.02); *B60L 2200/12* (2013.01); *B60L 2240/425* (2013.01)

(58) Field of Classification Search
CPC . B60L 2240/429; B60L 58/12; G01R 31/392; G01R 31/007; H02J 7/005; H02J 7/007; H02P 27/06; H02P 29/60; Y02T 10/64; Y02T 10/70
USPC .......... 318/139, 400.29, 400.26, 400.01, 700
See application file for complete search history.

(56) References Cited

U.S. PATENT DOCUMENTS

| | | | |
|---|---|---|---|
| 9,573,569 B2 * | 2/2017 | Hosaka | B60W 10/08 |
| 10,103,669 B2 * | 10/2018 | Lelkes | H02P 21/00 |
| 2012/0063900 A1 | 3/2012 | Kestermann | |
| 2015/0134169 A1 | 5/2015 | Kam et al. | |

OTHER PUBLICATIONS

International Preliminary Report on Patentability dated Apr. 14, 2021 with translation of Written Opinion of the International Searching Authority in connection with International Application No. PCT/FR2019/052261, 8 pages.

* cited by examiner

SYSTEM FOR ON-SITE DIAGNOSIS OF THE BATTERY OF AN ELECTRIC BICYCLE

CROSS-REFERENCE TO RELATED APPLICATIONS

This application is a 371 National Stage of International Application No. PCT/FR2019/052261, filed Sep. 25, 2019, which claims priority to French Patent Application No. 1859568, filed Oct. 16, 2018, the disclosures of which are herein incorporated by reference in their entirety.

TECHNICAL FIELD

The invention relates to diagnostics of rechargeable batteries in electric vehicles, and more particularly to diagnostics carried out in-place, i.e. implemented by the vehicle control device without dismantling the battery.

BACKGROUND

Electric vehicles are often capable of performing in-place diagnostics of their batteries. For this purpose, they are designed to monitor various battery parameters during normal vehicle use, in particular when starting, stopping, and/or running the vehicle. The measured parameters, typically capacity, internal resistance, and open circuit voltage at different states of charge, are used to estimate a "State of Health" SOH of the battery using charts. However, measurements, especially capacity, may vary with the battery's discharge profile, so state of health estimates vary while the actual SOH of the battery does not.

To estimate an SOH condition in a more reproducible way, it is preferred to perform regular diagnostics according to a same fixed discharge profile, which is usually unsuitable for normal vehicle use. Ideally, the battery is fully discharged during the diagnosis according to the fixed profile, to accurately estimate the capacity. A full discharge, due to the energy losses generated, is not suitable for large capacity batteries, such as those used in cars, but remains reasonable for electric bicycle batteries.

In order to perform in-place diagnostics according to a fixed discharge profile, it has been proposed to use the motor as a resistive load, for example in patent FR2920884. However, these techniques have not been applied to a full battery discharge, which can last several hours.

SUMMARY

A method for in-place diagnosis of a rechargeable electric vehicle battery, is generally provided, comprising the following steps: discharging the battery in a motor of the vehicle, using an internal resistance of the motor as a resistive load; measuring parameters of the battery during discharge to establish a state of health of the battery; estimating the temperature of the motor during discharge; and regulating the discharge current to stabilize the temperature of the motor at a constant admissible threshold.

The parameter measurement step may comprise the further steps of stopping the discharge, whereby the motor temperature drops; when the motor temperature reaches a low threshold, applying a high discharge current pulse, suitable for measuring the internal resistance of the battery; measuring the internal resistance of the battery; and resuming discharging.

The method may comprise the further steps of determining a heat capacity of the motor; and determining the low threshold of the motor temperature based on the thermal capacity of the motor, so that the application of the discharge current pulse raises the motor temperature to a value close to the admissible threshold.

The step of determining the heat capacity of the motor may comprise the prior steps of applying to the motor a discharge current pulse, able to bring the motor temperature close to a known temperature; allowing the motor to cool down; determining a thermal time constant based on the time taken by the motor to cool by a temperature difference; determining a thermal resistance of the engine from the power supplied by the battery in steady state discharging conditions where the motor temperature is at the permissible threshold; and determining the heat capacity from the thermal time constant and the thermal resistance.

The motor may be a three-phase motor, and the method may comprise, during the application of a discharge current, the step of connecting two of the three phases of the motor to a first terminal of the battery, and connecting the remaining phase to a second terminal of the battery.

The motor may be controlled by a field-oriented control circuit whose setpoints are adjusted to produce a high current and a low torque.

The vehicle may be a bicycle and the control circuit setpoints may be adjusted to produce rotation opposite a direction of travel of the bicycle.

BRIEF DESCRIPTION OF THE DRAWINGS

Embodiments will be exposed in the following description provided for exemplary purposes only, in relation to the appended drawings, in which.

DETAILED DESCRIPTION

The use of an electric motor as a resistive load for battery diagnostics presents some difficulties when the discharge phases are long, for instance when it is desired to completely discharge the battery. This is because it is usually desired to shorten the discharge phase by applying as high a discharge current as possible. An electric motor installed in its vehicle is generally not designed to continuously withstand such a high current for the relatively long time required for the discharge. This difficulty is exacerbated by the desire to maintain the motor stationary, which reduces ventilation and the motor's ability to dissipate the heat produced by the motor's internal resistance. Indeed, if the motor were allowed to spin freely, it would not be able to draw the desired current because of the increased back EMF.

A battery diagnostic method is presented herein that allows a complete discharge of the battery using the motor as a resistive load under conditions that do not affect the lifetime of the motor. To provide the highest possible discharge current under these conditions, the diagnostic method is based on a control loop that tends to stabilize the motor temperature at a constant value allowable over time by adjusting the discharge current.

The discharge current of the battery is thus automatically adapted to the cooling conditions of the motor—if the motor is placed in a cool, ventilated room, the discharge current will be higher than when the motor is placed in a hot room. Furthermore, since the heating of the motor, under stationary conditions, is proportional to the power it receives, it turns out that the control loop adjusts the current to produce a constant power. As the battery voltage decreases during discharge, the discharge current increases to maintain the power and temperature constant.

Such a discharge profile is unusual in conventional diagnostics that instead use a constant current. This is not important in practice, because it is not sought to compare results from different diagnostic methods, but to evaluate the evolution of the results of a same diagnostic method applied at regular intervals to the battery.

Figure 1:
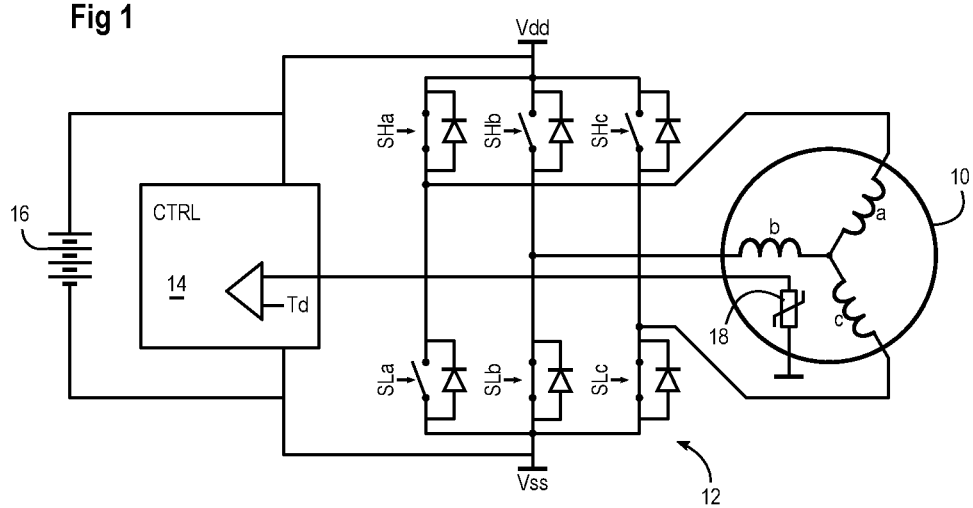
FIG. 1 schematically shows a three-phase motor of an electric vehicle and part of its control circuit.

FIG. 1 schematically illustrates a hardware configuration that may be used to implement the method. A three-phase motor 10 of an electric bicycle is associated with a control device, of which only the elements used to understand the process are shown. The windings or phases a, b, c, of the motor may be arranged in a star configuration, as shown. The control device may be of conventional type, for example using field-oriented control, known as FOC.

The control device includes a power stage 12, typically electronic switches forming an "H-bridge". Each phase of the motor is controlled by a pair of switches SH, SL, the first switch connecting the phase to a high supply line Vdd, and the second connecting the phase to a low supply line Vss. The switches associated with a phase are suffixed with the phase label. Each switch also has a freewheeling diode, which ensures that induced currents are drained off to a supply line even when the switches are open.

A control circuit 14 is configured to drive the motor through the power stage 12 according to sensor measurements and setpoints. Such elements are well known to the person skilled in the art and will not be described further.

A rechargeable battery 16 supplies the various elements of the control device via the Vdd and Vss lines.

To implement the process of the disclosure, a temperature feedback of the motor is used. For this purpose, the motor is, for example, provided with a temperature sensor 18 used by the control circuit 14. Such a sensor is often present in conventional control systems, to limit the current when the motor temperature, during normal operation, exceeds a threshold. In some systems without a temperature sensor, the temperature can be estimated by measuring the internal resistance of the motor windings, which varies with temperature. The estimated or sensor-provided temperature 18 may be compared in the control circuit, as shown, with a diagnostic temperature setpoint Td to, in a diagnostic mode, adjust the current such that the motor temperature tends toward that setpoint. The setpoint Td is selected as high as possible while ensuring that the lifetime of the motor is not affected by several hours of operation at this temperature.

The control circuit 14 may be programmed to implement the diagnostic process at the user's request. In a diagnostic mode, the circuit 14 controls the motor generally to maximize current and minimize torque, in fact to achieve near zero efficiency. For this purpose, two phases of the motor 10 may be permanently energized, for example phases a and b by closing switches SHa and SLb. The internal resistances of the windings a and b are then connected in series between the terminals of the battery 16, and serve as a resistive load to discharge the battery.

Preferably, the remaining phase c is also connected to one of the battery terminals, e.g. to the Vss terminal via the switch SLc. This reduces the resulting value of the resistive load and distributes the discharge current over the three phases, providing better heat dissipation. Moreover, this connection of the three phases produces two antagonistic torques that make the motor less prone to rotating, which may be a desired effect.

This method of connecting the phases, shown for illustrative purposes, is actually difficult to implement with a normal use of a conventional control circuit. According to an alternative, setpoints available in a conventional field-oriented control circuit may be used. In particular, a field setpoint may be adjusted to set the current at a high threshold; a torque setpoint may be adjusted to tend to cancel the torque; and a position (or rotation speed) setpoint may be adjusted to cancel or slow down the motor rotation. The last two parameters are linked, so that if a zero torque is set, the motor will remain in a fixed position. Similarly, if the position is set, the torque becomes zero when the position is reached. In these configurations, the currents are not equally distributed over the three phases.

Figure 2:
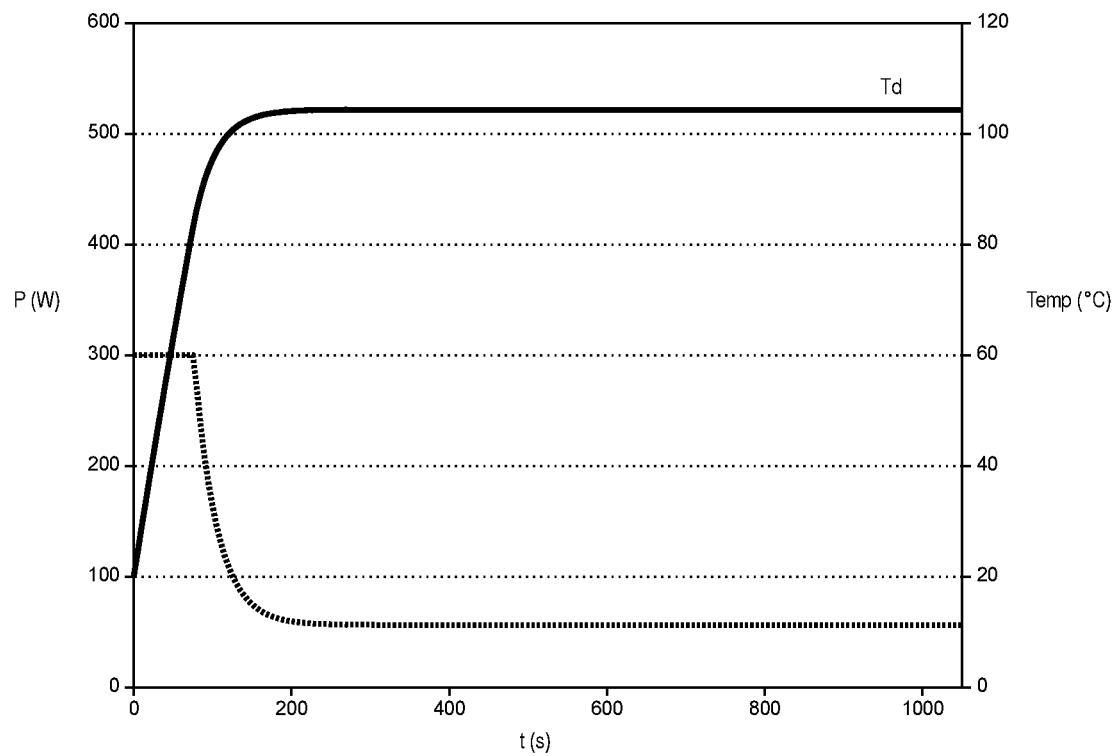
FIG. 2 represents a graph illustrating an example of the evolution of parameters during an initial phase of a diagnostic process according to the disclosure.

FIG. 2 is a graph illustrating an exemplary evolution of the power P supplied to the motor (dashed line) and the temperature Temp of the motor (solid line) over time t, at the start of a discharge phase of the diagnostic mode. As an example, the motor is a 250 W hub motor placed in a room at 20° C. and the battery has a capacity of 500 Wh.

The diagnostic phase may begin with an interval where the control system is set at full power, taking into account the typical constraints of the system (maximum motor current and maximum battery current). Since the internal resistances of the motor phases are low, on the order of 0.1 Ohm, the current drawn from the battery would exceed any tolerated threshold when the motor is motionless. Thus, the system starts by limiting the discharge current by using the switches in chopping mode, the resulting current being smoothed by the internal inductances of the windings. In the example, the system may be designed to chop the current to limit the power to 300 W.

From this point on, the temperature of the motor rises rapidly from 20° C. After about 80 s, the temperature reaches 85° C. The control system exits its full-power mode and applies, for example, proportional and integral (PI) control. As the temperature continues to rise from 85° C., the discharge current and power are reduced to slow down the temperature elevation. From 200 s, the temperature reaches the set point Td, and the power stabilizes. As an example, Td is about 105° C., and the power stabilizes at about 50 W.

During a full discharge phase according to conventional diagnostic methods, at least one measurement of the internal resistance of the battery is usually performed. Such a measurement involves applying a discharge current pulse of known characteristics and calculating the resistance from the current differential and the voltage differential measured before and after the falling edge of the current pulse. The current pulse has a recommended duration of at least 10 s and its intensity is as high as possible, because a higher intensity provides better accuracy for the measurement.

It is difficult to provide this measurement step directly in the discharge phase of FIG. 2, as the discharge current pulse would cause the motor to heat up beyond the permissible threshold Td.

Figure 3:
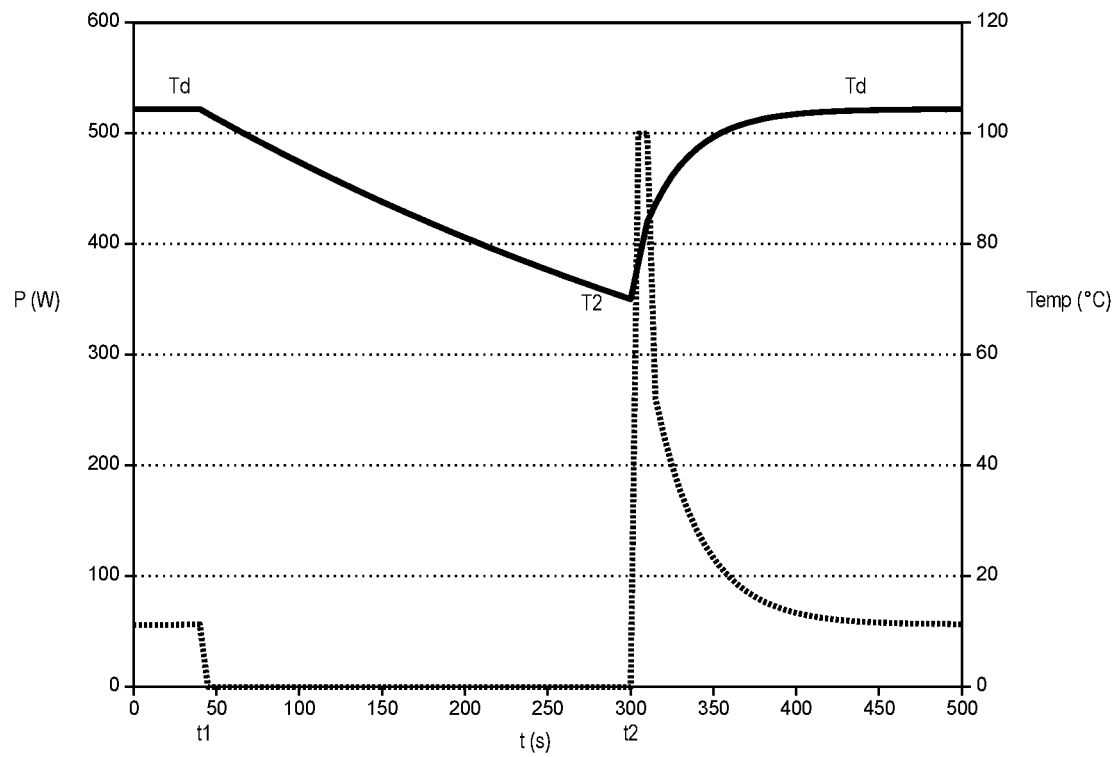
FIG. 3 represents a graph illustrating an example of the evolution of parameters during an intermediate phase of a diagnostic process according to the disclosure.

FIG. 3 represents a graph illustrating an example of the evolution of the power (dashed line) and the temperature (solid line) of the motor during an internal resistance measurement phase that has been adapted to the present process.

After starting the discharge phase according to FIG. 2, the motor having reached the temperature Td, the discharge current is interrupted at a time t1. The temperature of the motor then decreases.

At a time t2, here about 250 s later, the temperature reaches a low threshold T2 leaving enough heating margin for the motor to withstand a high current measurement pulse. The temperature T2 or the differential Td−T2 may be a programmed setpoint detected by the control circuit 14 by measuring the temperature.

Thus, starting at time t2, the system applies a high intensity discharge current pulse that lasts about 10 s. The intensity is at the limits of what the system can produce, here such that the power reaches 500 W, and permits a relatively accurate measurement of the internal resistance of the battery according to conventional methods.

The pulse causes a rapid rise in the motor temperature. The temperature T2 is chosen so that the motor temperature approaches the temperature Td, but does not exceed it, given the known energy value of the pulse.

At the end of the pulse, the normal discharge phase resumes—the regulation takes over and brings the temperature towards the threshold Td.

One difficulty with this measurement method lies in the choice of the differential Td−T2. Indeed, the differential should be sufficiently large so that the current pulse, of fixed characteristics, does not heat the motor above the temperature Td. This temperature rise of the motor, for a same current pulse, depends on the thermal capacity of the motor, which is a function of the motor structure. Of course, the differential Td−T2 may be chosen with a margin covering all conceivable conditions, but this lengthens the diagnostics procedure in the general case, especially if repeated measurements of the internal resistance of the battery are envisaged.

Figure 4:
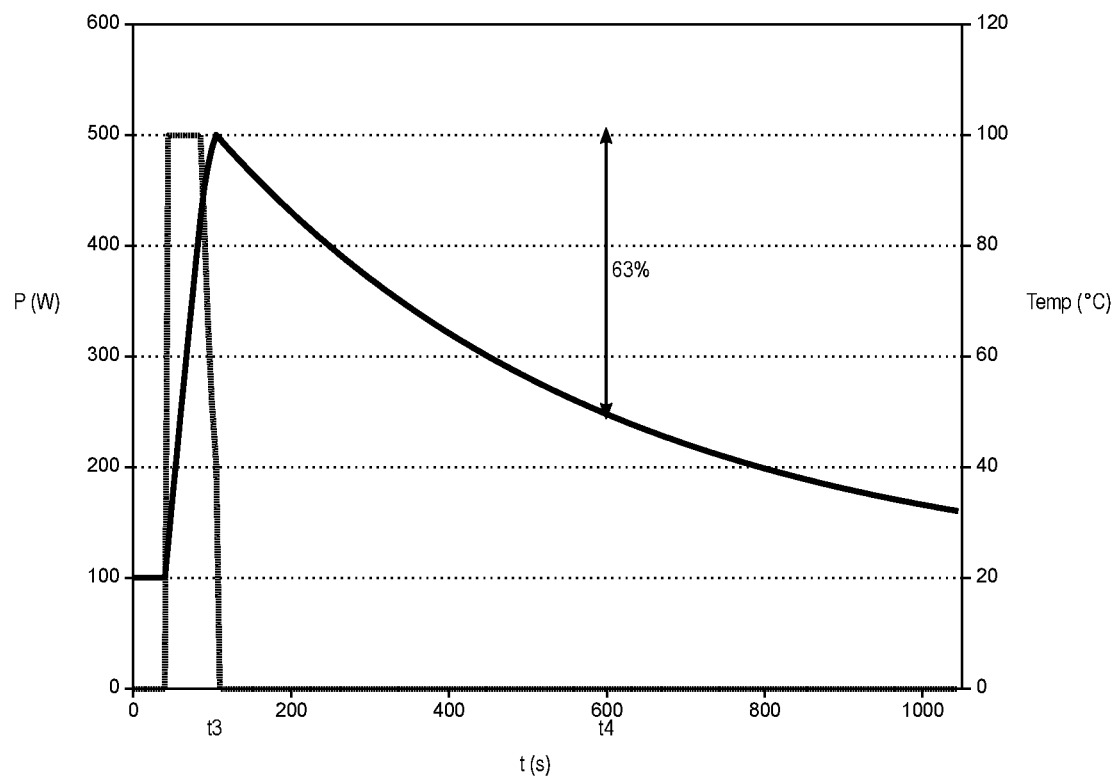
FIG. 4 represents a graph illustrating an example of the evolution of parameters during a preliminary phase of measuring a thermal time constant of the motor.

FIG. 4 represents a graph illustrating an example of the evolution of the power and the temperature during a preliminary step of estimating the thermal capacity of the motor. This measurement step, for determining the thermal constant of the motor upon cooling, is preferably performed just before the diagnostics phase, so as to best reflect the conditions of the motor during the diagnostics. The control circuit 14 may be programmed to systematically precede each diagnostic with this measurement step.

The motor being at room temperature before the diagnostic phase, it is sought to heat the motor to a known admissible high temperature, 100° C. in this example. For example, a 500 W discharge pulse is applied. At the end of the pulse, at a time t3, the current is cancelled, and the motor is left to cool. The time t4-t3 taken by the motor to lower its temperature by 63% of the differential between the temperature reached and the ambient temperature is recorded. The differential being 80° C. in the example, the time taken by the motor to cool from 100 to 50° C. is recorded, i.e. of the order of 500 s here—this value is the thermal time constant τ, equal to RC, where R is the thermal resistance of the motor with its ambient environment, and C is the thermal capacity of the motor.

During the following discharge phase, according to FIG. 2, a steady state is reached with a temperature differential (105-20=85° C.) and an electrical power consumption which maintains this differential (50 W), equivalent to the power dissipated by the motor to its environment. The thermal resistance R=85/50=1.7 K/W can thus be deduced. The value found previously for the thermal time constant yields C=τ/R=500/1.7=294 J/K. The required differential Td−T2 is thus chosen to be greater than E/C, where E is the energy of the measuring pulse.

Note that the internal resistance measurement phase (FIG. 3) can be used to measure other parameters used to estimate a state of health, such as the battery's open-circuit voltage. This voltage value is usually measured by momentarily cancelling the discharge current. Thus, this voltage value can be read in FIG. 3 from time t1.

Another parameter is the capacity of the battery. When the discharge current is constant, it is sufficient to multiply the current value by the discharge time. In the present situation, the current increases as the battery is discharged, and phases of internal resistance measurement disturb the steadiness of the discharge—here a "coulomb counter" technique is used, which takes into account the variations of the discharge current, and also the discharge produced by a possible thermal time constant measurement step (FIG. 4).

The described diagnostic method is applicable to any electric vehicle, but is primarily intended for electric bicycles or other small electric vehicles, whose batteries have a sufficiently low capacity that it is reasonable to discharge them completely during diagnosis, a solution that provides the most reliable estimates.

In the foregoing description, in order to use the motor windings as a resistive load, a static control mode has been mentioned that tends to produce a high discharge current without producing motor rotation, in fact a control mode that is undesirable in normal operation, since it produces almost zero efficiency. In such a configuration, it turns out that one of the windings dissipates half of the total power while the other two windings share the remaining half not necessarily in a perfectly balanced way.

To distribute the current more evenly across the three windings, and thus potentially increase the discharge current, the control circuit 14 may be programmed to apply set points tending to make the motor rotate.

Since the diagnosed battery may be that of a bicycle, it could be annoying if the wheel tends to spin, since a bicycle does not have a parking brake or a clutch or other motor disengagement device.

To limit the movement of the bike, the control can either be configured such that the current distribution is not perfectly balanced, or that the frequency of variation is very high. The latter solution would cause the bike to vibrate, but not to move unexpectedly, but could cause damage to the motor.

Under certain conditions, however, the motor can be allowed to rotate. This helps its heat dissipation and is perfectly feasible in a motor with a freewheel, in which case the control rotates the motor opposite the direction of travel. In principle, when the motor is free to rotate with no load, it tends to draw little current, the current consumption generally increasing with the resistive torque. On the other hand, by using a field-oriented control, it is possible to impose a field setpoint, and therefore a current, so as to increase the motor's current consumption without increasing its speed.

A motor without a freewheel may also be allowed to rotate if the user ensures that the bike is always parked with the drive wheel up and unhindered, so that the wheel can turn freely.

Although the present disclosure has been described with an exemplary embodiment, various changes and modifications may be suggested to one skilled in the art. It is intended that the present disclosure encompass such changes and modifications as fall within the scope of the appended claims. None of the description in this application should be read as implying that any particular element, step, or function is an essential element that must be included in the claims scope. The scope of patented subject matter is defined by the claims.

What is claimed is:

1. A method for diagnosing a rechargeable electric vehicle battery, the method comprising the following steps performed on the vehicle while the vehicle is not being used:
   discharging the battery into a motor of the vehicle, using an internal resistance of the motor as a resistive load;
   controlling the motor so that it consumes current while achieving near zero efficiency;
   measuring parameters of the battery during discharge to establish a state of health of the battery, wherein the state of health includes battery capacity;
   estimating a temperature of the motor during discharge; and
   regulating a discharge current to stabilize the temperature of the motor at a constant admissible threshold.

2. The method of claim 1, wherein measuring the parameters comprises:
   stopping the discharge, whereby the temperature of the motor drops;
   when the temperature of the motor reaches a low threshold, applying a high discharge current pulse, suitable for measuring the internal resistance of the battery;
   measuring the internal resistance of the battery; and
   resuming discharging.

3. The method of claim 2, further comprising:
   determining a heat capacity of the motor; and
   determining the low threshold of the temperature of the motor based on a thermal capacity of the motor, so that the application of the discharge current pulse raises the temperature of the motor to a value close to the admissible threshold.

4. The method of claim 3, wherein determining the heat capacity of the motor comprises:
   applying to the motor a discharge current pulse, able to bring the temperature of the motor close to a known temperature;
   allowing the motor to cool down;
   determining a thermal time constant based on a time taken by the motor to cool by a temperature difference;
   determining a thermal resistance of the motor from power supplied by the battery in steady state discharging conditions where the temperature of the motor is at a permissible threshold; and
   determining the heat capacity from the thermal time constant and the thermal resistance.

5. The method according to claim 1, wherein the motor is a three-phase motor, and the method comprises, during application of a discharge current, the step of connecting two of the three phases of the motor to a first terminal of the battery, and connecting the remaining phase to a second terminal of the battery.

6. The method of claim 1, wherein the motor is controlled by a field-oriented control circuit whose setpoints are adjusted to produce a high current and a low torque.

7. The method of claim 6, wherein the vehicle is a bicycle and the control circuit setpoints are adjusted to produce rotation opposite a direction of travel of the bicycle.

* * * * *